US007388805B2

(12) United States Patent
Lee et al.

(10) Patent No.: US 7,388,805 B2
(45) Date of Patent: Jun. 17, 2008

(54) DELAY LOCKED LOOP CIRCUIT FOR A SYNCHRONOUS SEMICONDUCTOR MEMORY DEVICE AND A METHOD OF GENERATING INFORMATION ABOUT A LOAD CONNECTED TO A DATA PIN OF A SYNCHRONOUS SEMICONDUCTOR MEMORY DEVICE

(75) Inventors: Jae-Jun Lee, Seongnam-si (KR); Hoe-Ju Chung, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 212 days.

(21) Appl. No.: 11/321,599

(22) Filed: Dec. 29, 2005

(65) Prior Publication Data

US 2006/0152259 A1 Jul. 13, 2006

(30) Foreign Application Priority Data

Jan. 12, 2005 (KR) ...................... 10-2005-0002874

(51) Int. Cl.
*G11C 8/00* (2006.01)
(52) U.S. Cl. ..................... 365/233.1; 365/194; 327/158
(58) Field of Classification Search ................ 327/158, 327/161, 147, 156; 365/233, 194, 189.01, 365/230.01
See application file for complete search history.

(56) References Cited

U.S. PATENT DOCUMENTS 6,426,900 B1 7/2002 Maruyama et al.

6,492,852 B2 * 12/2002 Fiscus ......................... 327/158
2005/0035799 A1 * 2/2005 Mikhalev et al. ............ 327/158

FOREIGN PATENT DOCUMENTS

| KR | 2001-0074824 | 8/2001 |
| KR | 1020020055910 A | 7/2002 |
| KR | 1020030011677 A | 2/2003 |
| KR | 1020030011697 A | 2/2003 |

* cited by examiner

*Primary Examiner*—Richard T. Elms
*Assistant Examiner*—Harry W Byrne
(74) *Attorney, Agent, or Firm*—F. Chau & Assoc., LLC

(57) ABSTRACT

A delay locked loop (DLL) circuit for a synchronous semiconductor memory device which can control a delay time of a feedback loop within the DLL circuit according to the magnitude of an external load, and a method of generating information about a load connected to a data pin of a synchronous semiconductor memory device are provided. The DLL circuit includes a replica output driver delaying an internal clock signal by a first delay time to output a first internal clock signal, the first delay time is a delay time of the internal clock signal which is generated by an output driver when a first load of a first magnitude is connected to an output terminal of the output driver, and a transfer/delay circuit transferring the first delay internal clock signal to a phase detector as a second delay internal clock signal when the first load is connected to the output terminal, and outputting the second delay internal clock signal to the phase detector by delaying the first delay internal clock signal by a second delay time, the second delay time is a delay time of the internal clock signal which is generated by the output driver when a second load of a second magnitude, which is larger than the first magnitude, is connected to the output terminal.

11 Claims, 5 Drawing Sheets

DELAY LOCKED LOOP CIRCUIT FOR A SYNCHRONOUS SEMICONDUCTOR MEMORY DEVICE AND A METHOD OF GENERATING INFORMATION ABOUT A LOAD CONNECTED TO A DATA PIN OF A SYNCHRONOUS SEMICONDUCTOR MEMORY DEVICE

CROSS-REFERENCE TO RELATED PATENT APPLICATION

This application claims priority to Korean Patent Application No. 10-2005-0002874, filed on Jan. 12, 2005, in the Korean Intellectual Property Office, the disclosure of which is incorporated by reference herein in its entirety.

BACKGROUND OF THE INVENTION

1. Technical Field

The present invention relates to a synchronous semiconductor memory device, and more particularly, to a delay locked loop (DLL) circuit for a synchronous semiconductor memory device which can control a delay time of a feedback loop within the DLL circuit according to the magnitude of a load connected to a data pin of the synchronous semiconductor memory device, and a method of generating information about a load connected to a data pin of a synchronous semiconductor memory device.

2. Discussion of the Related Art

Generally, synchronous semiconductor memory devices such as double data rate synchronous DRAMs (DDR SDRAMs) use an internal clock signal synchronized with an external clock signal to write or read data. More specifically, the DDR SDRAMs write or read data every half period of the internal clock signal. The internal clock signal is generated by using a delay locked loop (DLL) circuit.

FIG. 1 is a block diagram illustrating a conventional synchronous semiconductor memory device 100 including a DLL circuit 110 and an output driver 130.

The DLL circuit 110 includes a variable delay circuit 111, a phase detector 113, a control circuit 115, and a replica output driver 117.

The replica output driver 117, which is included in a feedback loop of the DLL circuit 110, replicates a delay time of an internal clock signal ICLK that is delayed through the output driver 130. The delay time of the internal clock signal ICLK is caused by a load LD (internal or external) connected a data pin DQ. The data pin DQ is connected to an output terminal of the output driver 130. The load LD may be a capacitor or a memory system including a single rank dual in-line memory module (DIMM). The magnitude of the load LD when it is a memory system including a single rank DIMM is relatively small.

As shown in FIG. 1, the phase detector 113 detects a phase difference between a delayed version of the internal clock signal ICLK_D delayed through the replica output driver 117 and an external clock signal ECLK. The control circuit 115 generates a control signal to control the amount of delay through the variable delay circuit 111 in response to an output signal from the phase detector 113. The variable delay circuit 111 delays the external clock signal ECLK to generate the internal clock signal ICLK synchronized with the external clock signal ECLK in response to the control signal from the control circuit 115.

The output driver 130 synchronizes data DATA output from a memory cell (not shown) of the synchronous semiconductor memory device 100 with the internal clock signal ICLK and outputs the data DATA to the data pin DQ. The output driver 130 is also called an output buffer.

FIG. 2 illustrates an example of the load LD connected to the data pin DQ. In particular, a memory system 200 is illustrated as the load LD.

Referring to FIG. 2, the memory system 200 includes a memory controller 210, a bus channel 220, memory modules 230 and 240, and memory slots 250 and 260.

The memory controller 210 controls data to be input to or output from the memory modules 230 and 240 through the bus channel 220. The memory controller 210 is also called a chip set.

The bus channel 220 includes a data bus and a control bus. The control bus transmits a control signal such as a clock signal or an address signal to control data transmitted through the data bus.

Each of the memory modules 230 and 240 is installed (or inserted) in corresponding memory slots 250 and 260 so that they may be connected to the memory controller 210 through the bus channel 220. Each of the memory modules 230 and 240 is a DIMM with two ranks R0 and R1, or R2 and R3. Each of the ranks R0, R1, R2 and R3 may include a plurality of synchronous semiconductor memory devices such as the synchronous semiconductor memory device 100 illustrated in FIG. 1. The ranks R0 and R1, or R2 and R3 may be configured to form a single rank DIMM in which a single semiconductor memory device is connected to a single data bus or a double rank DIMM in which two semiconductor memory devices are connected to a single data bus.

Referring back to FIG. 1, the delay time of the internal clock signal ICLK generated by the output driver 130 is changed according to the magnitude of the load LD (or the number of ranks) connected to the data pin DQ. In other words, when the load LD is a memory system including a single rank DIMM, which is considered to be a relatively light load, the delay time of the internal clock signal ICLK is small, but when the load LD is a memory system including a double rank DIMM, which is considered to be a relatively heavy load, the delay time of the internal clock signal ICLK is large.

In addition, the delay time of the internal clock signal ICLK that is delayed through the replica output driver 117 is set on the basis of a memory system including a single rank DIMM. Therefore, if the load LD is a memory system including a double rank DIMM, a clock access time tAC margin of the synchronous semiconductor memory device 100 is decreased. In other words, an interval between a reference edge of the external clock signal ECLK and the output of data may be decreased. Therefore, the output driver 130 may not output valid data in synchronization with the external clock signal ECLK. Further, as an operating frequency of the synchronous semiconductor memory device 100 increases, the tAC margin may additionally decrease.

A need therefore exists for a synchronous semiconductor memory device including a DLL circuit that is capable of preventing a tAC margin from decreasing so that valid data may be output.

SUMMARY OF THE INVENTION

A DLL circuit is provided for a synchronous semiconductor memory device which can increase the tAC margin by controlling a delay time of a feedback loop within the DLL circuit according to the magnitude of a load connected to a data pin of the synchronous semiconductor memory device. In addition, a method is provided for generating information about a load connected to a data pin of a synchronous semiconductor memory device.

According to an embodiment of the present invention, there is provided a DLL circuit for a synchronous semiconductor memory device, the DLL circuit comprising: a replica output driver delaying an internal clock signal by a first delay time to output a first delay internal clock signal, the first delay time is a delay time of the internal clock signal which is generated by an output driver when a first load of a first magnitude is connected to an output terminal of the output driver; and a transfer/delay circuit transferring the first delay internal clock signal to a phase detector as a second delay internal clock signal when the first load is connected to the output terminal, and outputting the second delay internal clock signal to the phase detector by delaying the first delay internal clock signal by a second delay time, the second delay time is a delay time of the internal clock signal which is generated by the output driver when a second load of a second magnitude, which is larger than the first magnitude, is connected to the output terminal.

The DLL circuit further comprises: the phase detector detecting a phase difference between the second delay internal clock signal and an external clock signal; a control circuit generating a control signal in response to an output signal of the phase detector; and a variable delay circuit generating the internal clock signal synchronized with the external clock signal by delaying the external clock signal in response to the control signal. The output terminal may be a data pin of the output driver.

The first load may be a memory system including a single rank dual in-line memory module (DIMM) and the second load may be a memory system including a double rank DIMM.

The transfer/delay circuit may operate in response to serial presence detection (SPD) information that is provided from a mode register set of the synchronous semiconductor memory device and includes rank configuration information of the DIMMs, and the SPD information, which is stored in a read only memory (ROM) included in the DIMM, may be read from the ROM and then stored in the mode register set by a memory controller of the memory system.

The transfer/delay circuit may also operate in response to load information provided from a logic circuit included in the synchronous semiconductor memory device, and the load information, which indicates whether a load connected to the output terminal is the first load or the second load, may be generated by the combination of a write command that initiates a write operation of the synchronous semiconductor memory device and a control signal that activates or deactivates an On Die Termination (ODT) circuit connected to the output terminal.

The write command may be generated by the combination of a chip selection signal, a row address strobe signal, a column address strobe signal, and a write enable signal, and the logic circuit may include a register. The control signal may be activated when the first load is the memory system including a single rank DIMM, and deactivated when the second load is the memory system including a double rank DIMM.

The transfer/delay circuit may operate in response to load information provided from a logic circuit included in the synchronous semiconductor memory device and the load information, which indicates whether a load connected to the output terminal is the first load or the second load, may be generated by the combination of a write command that indicates a write operation of the synchronous semiconductor memory device and termination resistor information that indicates a resistance value of a termination resistor included in the ODT circuit connected to the output terminal.

When the termination resistor information indicates a first termination resistance value when the first load is the memory system including a single rank DIMM, the termination resistor information may indicate a second termination resistance value, which is double the first termination resistance value, when the second load is the memory system including a double rank DIMM.

According to another embodiment of the present invention, there is provided a method of generating load information that indicates whether a load connected to a data pin of a synchronous semiconductor memory device is a first load having a first magnitude or a second load having a second magnitude, which is larger than the first magnitude, the method comprising: receiving a write command that initiates a write operation of the synchronous semiconductor memory device from a memory controller controlling the write operation; receiving a control signal from the memory controller, the control signal activating or deactivating an ODT circuit connected to the data pin; and generating the load information by combining the received write command and the received control signal. The load information may be provided to a DLL of the synchronous semiconductor memory device.

The write command may be generated by the combination of a chip selection signal, a row address strobe signal, a column address strobe signal, and a write enable signal.

The control signal may be activated when the first load is a memory system including a single rank DIMM, and deactivated when the second load is a memory system including a double rank DIMM.

According to still another embodiment of the present invention, there is provided a method of generating load information that indicates whether a load connected to a data pin of a synchronous semiconductor memory device is a first load having a first magnitude or a second load having a second magnitude, which is larger than the first magnitude, the method comprising: receiving a write command that initiates a write operation of the synchronous semiconductor memory device from a memory controller controlling the write operation; generating termination resistor information that indicates a resistance value of a termination resistor included in an ODT circuit which is connected to the data pin; and generating the load information by combining the received write command and the generated termination resistor information. The load information may be provided to a DLL of the synchronous semiconductor memory device.

The write command may be generated by the combination of a chip selection signal, a row address strobe signal, a column address strobe signal, and a write enable signal. When the termination resistor information indicates a first termination resistance value when the first load is the memory system including a single rank DIMM, the termination resistor information may indicate a second termination resistance value, which is double the first termination resistance value, when the second load is the memory system including a double rank DIMM.

BRIEF DESCRIPTION OF THE DRAWINGS

The above and other features of the present invention will become more apparent by describing in detail exemplary embodiments thereof with reference to the attached drawings in which.

DETAILED DESCRIPTION OF EXEMPLARY EMBODIMENTS

Figure 1:
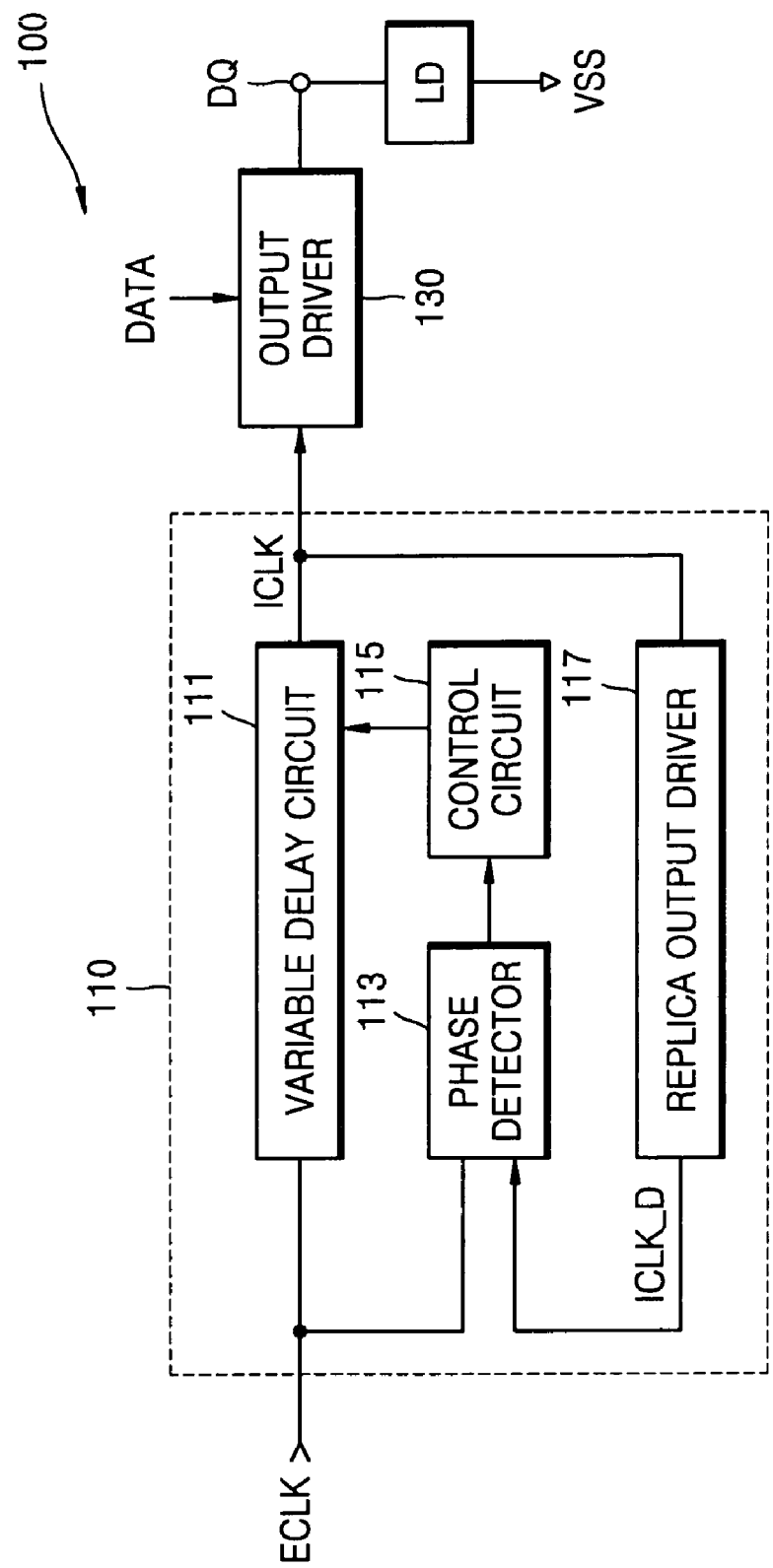
FIG. 1 is a block diagram illustrating a conventional synchronous semiconductor memory device including a delay locked loop (DLL) circuit.

Hereinafter, exemplary embodiments of the present invention will be described in detail with reference to the attached drawings. Like reference numerals in the drawings denote like elements.

Figure 3:
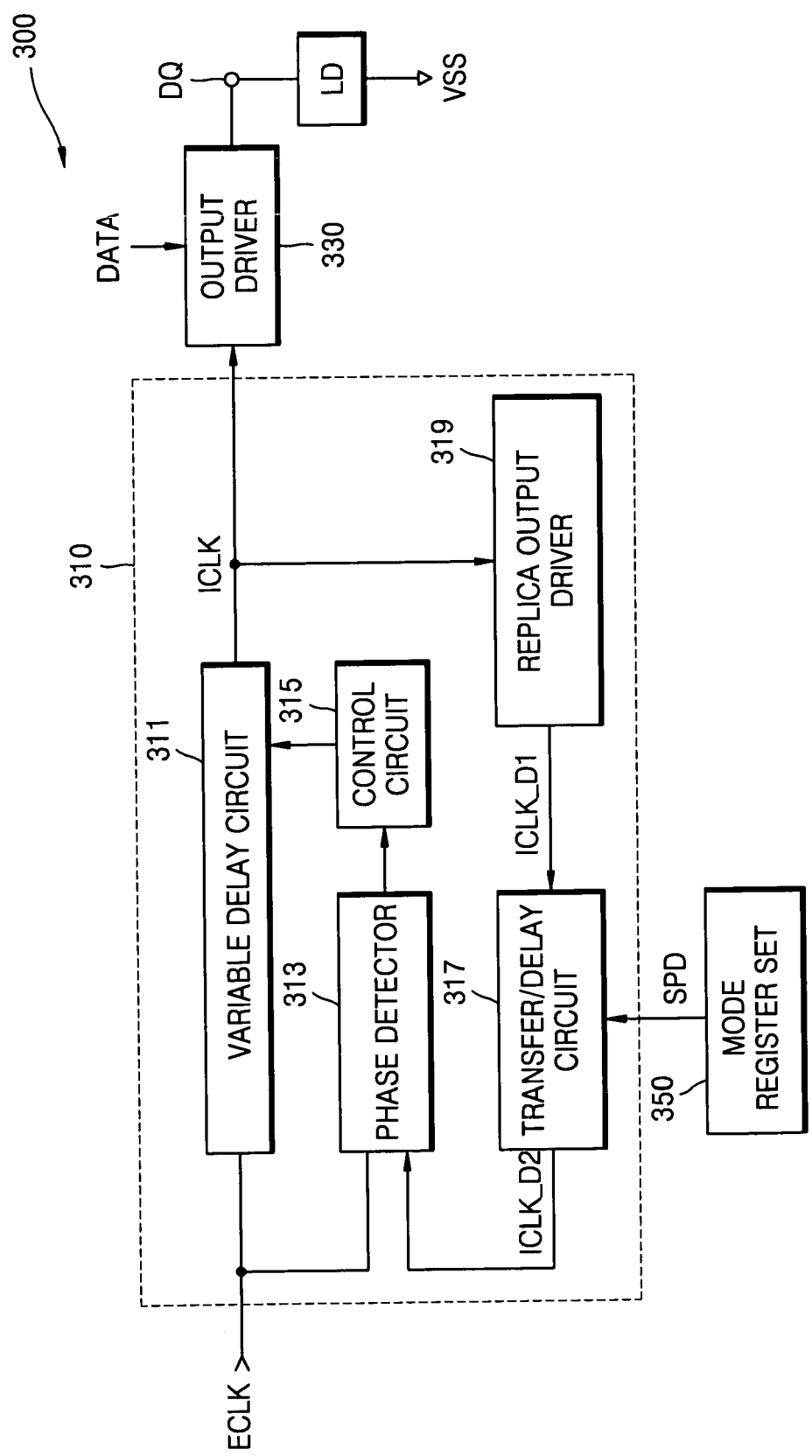
FIG. 3 is a block diagram illustrating a synchronous semiconductor memory device including a DLL circuit according to an exemplary embodiment of the present invention.

FIG. 3 is a block diagram illustrating a synchronous semiconductor memory device 300 including a delay locked loop (DLL) circuit 310 according to an embodiment of the present invention. Referring to FIG. 3, the synchronous semiconductor memory device 300 includes the DLL circuit 310, an output driver 330, and a mode register set (MRS) 350.

The DLL circuit 310 includes a variable delay circuit 311, a phase detector 313, a control circuit 315, a transfer/delay circuit 317, and a replica output driver 319.

The replica output driver 319, which is included in a feedback loop of the DLL circuit 310, delays an internal clock signal ICLK by a first delay time to output a first delay internal clock signal ICLK_D1. The first delay time is generated when a load LD is connected to a data pin DQ. The data pin DQ may be connected to an output terminal of the output driver 330. The load LD may be a capacitor or, for example, a memory system including a single rank dual in-line memory module (DIMM) having a magnitude that is relatively small. The memory system including a single rank DIMM is hereinafter referred to as a first load.

The transfer/delay circuit 317 outputs the first delay internal clock signal ICLK_D1 as a second delay internal clock signal ICLK_D2 without delay when the first load is connected to the output terminal of the output driver 330. The transfer/delay circuit 317 delays the first delay internal clock signal ICLK_D1 by a second delay time that is a delay time of an internal clock signal ICLK generated in the output driver 330 and outputs the delayed first delay internal clock signal ICLK_D1 as a second delay internal clock signal ICLK_D2 when a second load is connected to the output terminal of the output driver 330. The magnitude of the second load is larger than the magnitude of the first load, and the second load may be, for example, a memory system including a double rank DIMM.

As shown in FIG. 3, the transfer/delay circuit 317 operates in response to serial presence detection (SPD) information SPD. The SPD information SPD is provided from the mode register set 350, and includes rank configuration information indicating whether the DIMM is a single rank, a double rank, or another multi-rank DIMM. In other words, the SPD information SPD indicates the magnitude (or the number of ranks) of the load LD connected to the data pin DQ.

The mode register set 350 stores the SPD information SPD and outputs it to the transfer/delay circuit 317. The SPD information SPD, which is stored in a read only memory (ROM) (not shown) included in the DIMM, is read from the ROM and then stored in the mode register set 350 by a memory controller of the memory system such as the memory controller 210 of FIG. 2.

The phase detector 313 detects a phase difference between the second delay internal clock signal ICLK_D2 and the external clock signal ECLK. The control circuit 315 generates a control signal controlling the amount of delay of the variable delay circuit 311 in response to an output signal of the phase detector 313. The variable delay circuit 311 delays the external clock signal ECLK to generate an internal clock signal ICLK synchronized with the external clock signal ECLK in response to the control signal.

The output driver 330 synchronizes data DATA output from a memory cell (not shown) of the synchronous semiconductor memory device 300 with the internal clock signal ICLK and outputs the data to the data pin DQ. The output driver 330 is also called an output buffer.

As described above, the DLL circuit 310 of the synchronous semiconductor memory device 300 includes the transfer/delay circuit 317 for controlling the delay time of the feedback loop according to the magnitude of the load LD connected to the data pin DQ, thus improving a clock access time tAC margin of the synchronous semiconductor memory device 300.

Figure 4:
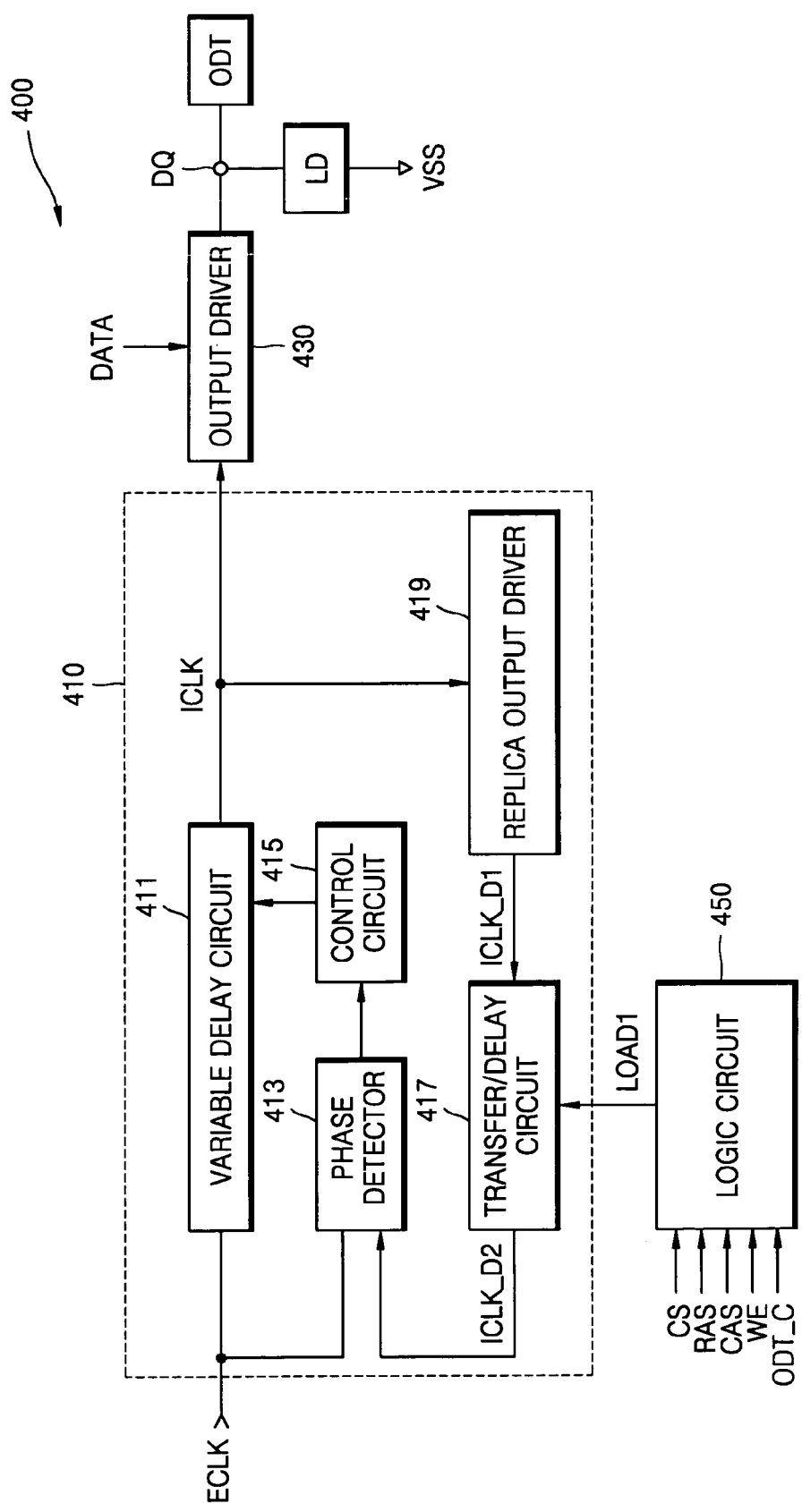
FIG. 4 is a block diagram illustrating a synchronous semiconductor memory device including a DLL circuit according to another exemplary embodiment of the present invention.

FIG. 4 is a block diagram illustrating a synchronous semiconductor memory device 400 including a DLL circuit 410 according to another embodiment of the present invention. Referring to FIG. 4, the synchronous semiconductor memory device 400 includes the DLL circuit 410, an output driver 430, and a logic circuit 450.

The DLL circuit 410 includes a variable delay circuit 411, a phase detector 413, a control circuit 415, a transfer/delay circuit 417, and a replica output driver 419.

The DLL circuit 410 and the output driver 430 are substantially the same as the DLL circuit 310 and the output driver 330, which are illustrated in FIG. 3, therefore detailed descriptions thereof are omitted.

As shown in FIG. 4, the transfer/delay circuit 417 operates in response to load information LOAD1 provided from the logic circuit 450. The load information LOAD1, which indicates whether a load LD connected to a data pin DQ is a first load or a second load, is generated by the combination of a write command that initiates a write operation of the synchronous semiconductor memory device 400 and an On Die Termination (ODT) control signal ODT_C that activates or deactivates an ODT circuit connected to the data pin DQ. For example, the ODT control signal ODT_C is activated to a high level when the first load is a memory system including a single rank DIMM, and deactivated to a low level when the second load is a memory system including a double rank DIMM.

The write command is generated by the combination of a chip selection signal CS, a row address strobe signal RAS, a column address strobe signal CAS, and a write enable signal WE input to the logic circuit 450. The chip selection signal CS activates or deactivates the synchronous semiconductor memory device 400, and the row address strobe signal RAS indicates that a row address signal is being applied. Further, the column address strobe signal CAS indicates that a column address signal is being applied, and the write enable signal WE is a control signal that activates the write operation of the synchronous semiconductor memory device 400.

The ODT circuit is a termination matching circuit and is included in the synchronous semiconductor memory device 400 to prevent distortion of data due to the reflection of data that is input when the write operation of the synchronous semiconductor memory device 400 is performed. The ODT circuit includes a termination resistor (not shown) and a switch (not shown) that is turned on/off to supply or cut-off a predetermined voltage to the termination resistor in response to the ODT control signal ODT_C.

The logic circuit 450 includes a register (not shown), stores the load information LOAD1 and outputs the load information LOAD1 to the transfer/delay circuit 417. In other words, the logic circuit 450 combines the write command and the ODT control signal ODT_C to generate the load information LOAD1 and stores the load information LOAD1 therein.

As described above, since the DLL circuit 410 of the synchronous semiconductor memory device 400 includes a transfer/delay circuit 417, which can control the delay time of a feedback loop according to the magnitude of the load LD connected to the data pin DQ, the tAC margin of the synchronous semiconductor memory device 400 can be increased.

A method of generating load information LOAD1 of a synchronous semiconductor memory device according to an embodiment of the present invention will now be described with reference to FIG. 4. The load information LOAD1 indicates whether the load LD connected to the data pin DQ of the synchronous semiconductor memory device 400 is the first load, the magnitude of which is relatively small, or the second load, the magnitude of which is relatively large.

Figure 2:
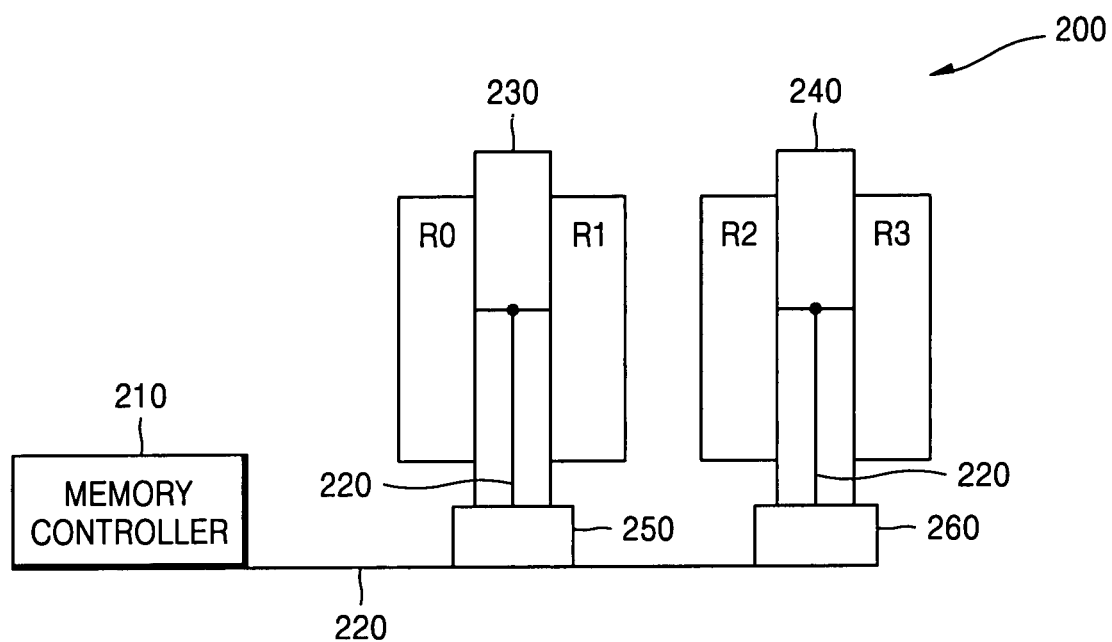
FIG. 2 is a diagram illustrating an exemplary load LD in FIG. 1.

In the method, during a first receiving operation, the synchronous semiconductor memory device 400 receives a write command initiating the write operation from a memory controller such as the memory controller 210 of FIG. 2. The memory controller controls the write operation of the synchronous semiconductor memory device 400. The write command may be generated by the combination of the chip selection signal CS, the row address strobe signal RAS, the column address strobe signal CAS, and the write enable signal WE.

In a second receiving operation, the synchronous semiconductor memory device 400 receives the ODT control signal ODT_C for activating/deactivating the ODT circuit connected to the data pin DQ from the memory controller. For example, when the first load is a memory system including a single rank DIMM, the ODT control signal ODT_C can be activated to a high level, and when the second load is a memory system including a double rank DIMM, the ODT control signal ODT_C can be deactivated to a low level.

In a generating operation, the logic circuit 450 combines the write command received in the first receiving operation and the ODT control signal ODT_C received in the second receiving operation to generate the load information LOAD1. The load information LOAD1 may then be provided to a component such as the DLL circuit 410 of the synchronous semiconductor memory device 400.

Figure 5:
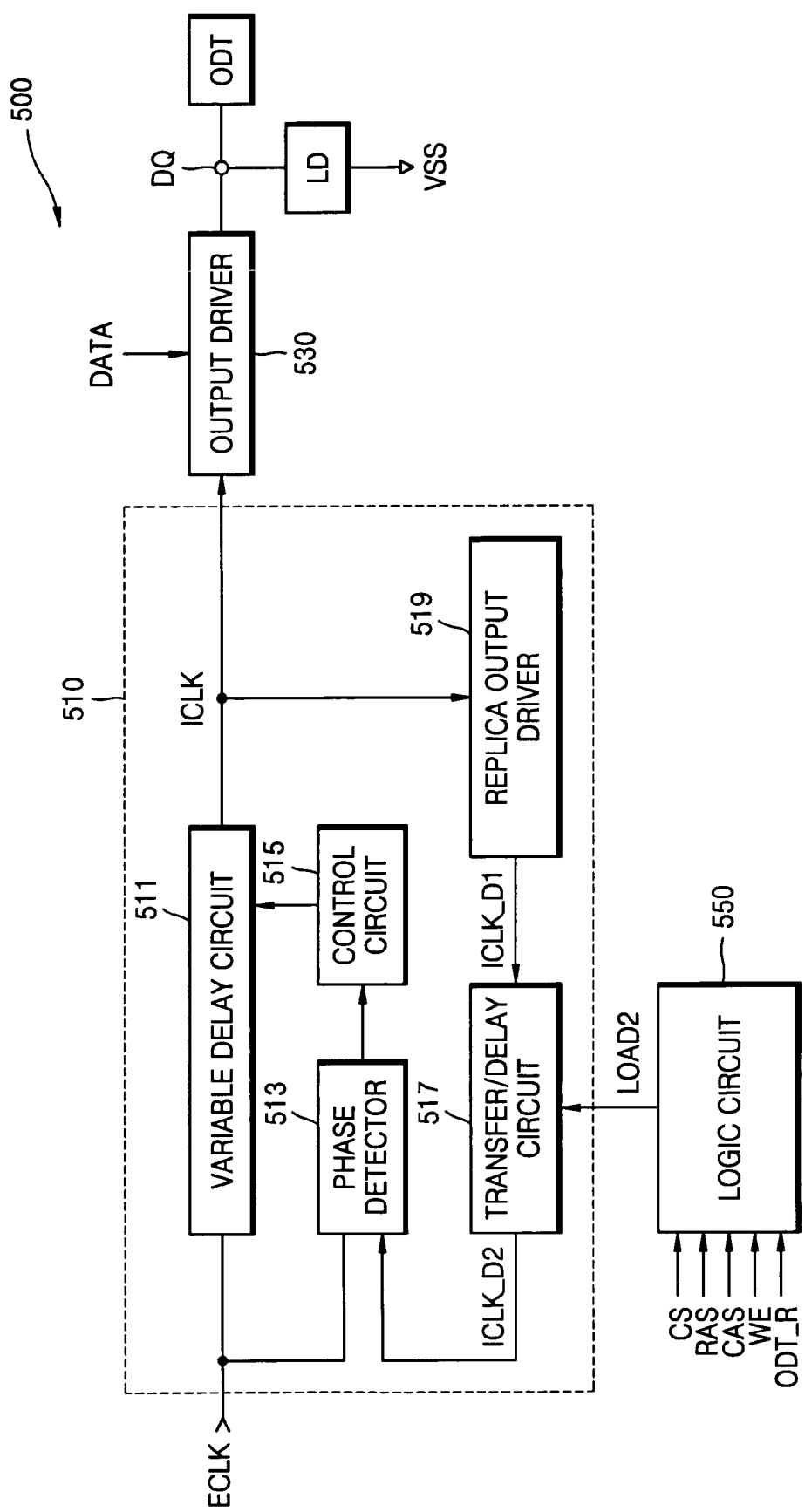
FIG. 5 is a block diagram illustrating a synchronous semiconductor memory device including a DLL circuit according to still another exemplary embodiment of the present invention.

FIG. 5 is a block diagram illustrating a synchronous semiconductor memory device 500 including a DLL circuit 510 according to still another embodiment of the present invention. Referring to FIG. 5, the synchronous semiconductor memory device 500 includes the DLL circuit 510, an output driver 530, and a logic circuit 550.

The DLL circuit 510 includes a variable delay circuit 511, a phase detector 513, a control circuit 515, a transfer/delay circuit 517, and a replica output driver 519.

Since the DLL circuit 510 and the output driver 530 are substantially the same as the DLL circuit 310 and the output driver 330, which are illustrated in FIG. 3, detailed descriptions thereof will be omitted.

As shown in FIG. 5, the transfer/delay circuit 517 operates in response to load information LOAD2 provided from the logic circuit 550. The load information LOAD2, which indicates whether a load LD connected to a data pin DQ is a first load or a second load, is generated by the combination of a write command that initiates a write operation of the synchronous semiconductor memory device 500 and termination resistor information ODT_R that indicates the resistance value of a termination resistor (not shown) included in an ODT circuit connected to the data pin DQ.

The termination resistor information ODT_R is generated when the synchronous semiconductor memory device 500 performs the write operation according to the write command. For example, if the termination resistor information ODT_R indicates a first termination resistance value Rodt when the first load is a memory system including a single rank DIMM, the termination resistor information ODT_R indicates a second termination resistance value 2*Rodt, which is double the first termination resistance value Rodt, when the second load is a memory system including a double rank DIMM.

The write command is generated by the combination of a chip selection signal CS, a row address strobe signal RAS, a column address strobe signal CAS, and a write enable signal WE. Descriptions of the chip selection signal CS, the row address strobe signal RAS, the column address strobe signal CAS, and the write enable signal WE are similar to or the same as the descriptions of the corresponding signals illustrated in FIG. 4. Further, the description of the ODT circuit is similar to or the same as the ODT circuit described with reference to FIG. 4. Accordingly, detailed descriptions thereof will be omitted.

As further shown in FIG. 5, the logic circuit 550 includes a register (not shown), stores the load information LOAD2, and outputs the load information LOAD2 to the transfer/delay circuit 517. In other words, the logic circuit 550 generates the load information LOAD2 by generating the write command and the termination resistor information ODT_R and stores the load information LOAD2 therein.

As described above, since the DLL circuit 510 of the synchronous semiconductor memory device 500 includes the transfer/delay circuit 517 that can control the delay time of a feedback loop according to the magnitude of the load LD connected to the data pin DQ, the tAC margin of the synchronous semiconductor memory device 500 can be increased.

A method of generating load information LOAD2 of a synchronous semiconductor memory device according to another embodiment of the present invention will now be descried with reference to FIG. 5. The load information LOAD2 indicates whether the load LD connected to the data pin DQ of the synchronous semiconductor memory device 500 is a first load, the magnitude of which is relatively small, or a second load, the magnitude of which is relatively large.

In the method, during a receiving operation, the synchronous semiconductor memory device 500 receives a write command that initiates a write operation from a memory controller such as the memory controller 210 of FIG. 2. The memory controller controls the write operation of the synchronous semiconductor memory device 500. The write command may be generated by the combination of the chip selection signal CS, the row address strobe signal RAS, the column address strobe signal CAS, and the write enable signal WE.

In a first generating operation, the synchronous semiconductor memory device 500 generates the termination resistor information ODT_R that indicates the resistance value of the termination resistor which is included in the ODT circuit connected to the data pin DQ while performing the write operation. For example, if the termination resistor information ODT_R indicates a first termination resistance value Rodt when the first load is a memory system including a single rank DIMM, the termination resistor information ODT_R indicates a second termination resistance value 2*Rodt, which is double the first terminal resistance value Rodt, when the second load is a memory system including a double rank DIMM.

In a second generating operation, the logic circuit 550 combines the write command received in the receiving operation and the termination resistor information ODT_R generated in the first generating operation to generate the load information LOAD2. The load information LOAD2 may be provided to a component such as the DLL circuit 510 of the synchronous semiconductor memory device 500.

According to an embodiment of the present invention, a DLL circuit for a synchronous semiconductor memory device can control the delay time through a feedback loop thereof according to the magnitude of a load (or the number of the ranks) connected to a data pin of an output driver of the synchronous semiconductor memory device, thus compensating for a delay time of the output driver according to the magnitude of the load. Therefore, a tAC margin of the synchronous semiconductor memory device can be increased, and thus, a read operation of the synchronous semiconductor memory device can be performed at a high speed. Further, by using a method of generating load information according to an embodiment of the present invention, the load information according to the magnitude of the load can be generated and provided to a component of the synchronous semiconductor memory device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A delay locked loop circuit for a synchronous semiconductor memory device, the delay locked loop circuit comprising:
    a replica output driver delaying an internal clock signal by a first delay time to output a first delay internal clock signal, the first delay time is a delay time of the internal clock signal which is generated by an output driver when a first load of a first magnitude is connected to an output terminal of the output driver; and
    a transfer/delay circuit transferring the first delay internal clock signal to a phase detector as a second delay internal clock signal when the first load is connected to the output terminal, and outputting the second delay internal clock signal to the phase detector by delaying the first delay internal clock signal by a second delay time, the second delay time is a delay time of the internal clock signal which is generated by the output driver when a second load of a second magnitude, which is larger than the first magnitude, is connected to the output terminal.

2. The delay locked loop circuit of claim 1, wherein the first load is a memory system including a single rank dual in-line memory module (DIMM) and the second load is a memory system including a double rank DIMM.

3. The delay locked loop circuit of claim 2, wherein the transfer/delay circuit operates in response to serial presence detection (SPD) information that is provided from a mode register set of the synchronous semiconductor memory device and includes rank configuration information of the DIMMs.

4. The delay locked loop circuit of claim 2, wherein the transfer/delay circuit operates in response to load information provided from a logic circuit in the synchronous semiconductor memory device, and the load information, which indicates whether a load connected to the output terminal is the first load or the second load, is generated by the combination of a write command that initiates a write operation of the synchronous semiconductor memory device and a control signal that activates or deactivates an On Die Termination (ODT) circuit connected to the output terminal.

5. The delay locked loop circuit of claim 4, wherein the write command is generated by the combination of a chip selection signal, a row address strobe signal, a column address strobe signal, and a write enable signal.

6. The delay locked loop circuit of claim 4, wherein the control signal is activated when the first load is the memory system including a single rank DIMM, and deactivated when the second load is the memory system including a double rank DIMM.

7. The delay locked loop circuit of claim 2, wherein the transfer/delay circuit operates in response to load information provided from a logic circuit included in the synchronous semiconductor memory device and the load information, which indicates whether a load connected to the output terminal is the first load or the second load, is generated by the combination of a write command that initiates a write operation of the synchronous semiconductor memory device and termination resistor information that indicates a resistance value of a termination resistor included in the ODT circuit connected to the output terminal.

8. The delay locked loop circuit of claim 7, wherein the write command is generated by the combination of a chip selection signal, a row address strobe signal, a column address strobe signal, and a write enable signal.

9. The delay locked loop circuit of claim 7, wherein when the termination resistor information indicates a first termination resistance value when the first load is the memory system including a single rank DIMM, the termination resistor information indicates a second termination resistance value, which is double the first termination resistance value, when the second load is the memory system including a double rank DIMM.

10. The delay locked loop circuit of claim 1, wherein the output terminal is a data pin of the output driver.

11. The delay locked loop circuit of claim 1, further comprising:
    the phase detector detecting a phase difference between the second delay internal clock signal and an external clock signal;
    a control circuit generating a control signal in response to an output signal of the phase detector; and
    a variable delay circuit generating the internal clock signal synchronized with the external clock signal by delaying the external clock signal in response to the control signal.

* * * * *